United States Patent
Fitzgerald et al.

(10) Patent No.: US 7,816,250 B2
(45) Date of Patent: Oct. 19, 2010

(54) COMPOSITE SOLDER TIM FOR ELECTRONIC PACKAGE

(75) Inventors: Tom Fitzgerald, Phoenix, AZ (US); Carl Deppisch, Chandler, AZ (US); Fay Hua, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 201 days.

(21) Appl. No.: 11/540,027

(22) Filed: Sep. 29, 2006

(65) Prior Publication Data

US 2008/0090405 A1 Apr. 17, 2008

(51) Int. Cl.
H01L 21/208 (2006.01)
H01L 33/62 (2010.01)

(52) U.S. Cl. .................................................. 438/613
(58) Field of Classification Search ................ 438/612
See application file for complete search history.

(56) References Cited

U.S. PATENT DOCUMENTS

| | | | |
|---|---|---|---|
| 4,493,736 A * | 1/1985 | Adams ...................... | 29/527.7 |
| 6,563,225 B2 * | 5/2003 | Soga et al. .................. | 257/782 |
| 2008/0023665 A1 * | 1/2008 | Weiser et al. ................ | 252/71 |

OTHER PUBLICATIONS

Atkinson, Modelling the semisold procession of metallic alloys, Apr. 1, 2004, Progress in Materials Science 50 pp. 341-412.*
Atkinson, H. V., "Modelling the Semisolid Processing of Metallic Alloys," Progress in Materials Science 50 (2005), 341-412, www.elsevier.com/locate/pmatsci.

* cited by examiner

*Primary Examiner*—Zandra Smith
*Assistant Examiner*—Pamela E Perkins
(74) *Attorney, Agent, or Firm*—Blakely, Sokoloff, Taylor & Zafman LLP

(57) ABSTRACT

A method includes providing a mixture of molten indium and molten aluminum, and agitating the mixture while reducing its temperature until the aluminum changes from liquid phase to solid phase, forming particles distributed within the molten indium. Agitation of the mixture sufficiently to maintain the aluminum substantially suspended in the molten aluminum continues while further reducing the temperature of the mixture until the indium changes from a liquid phase to a solid phase. A metallic composition is formed, including indium and particles of aluminum suspended within the indium, the aluminum particles being substantially free from oxidation.

The metallic (solder) composition can be used to form an assembly, including an integrated circuit (IC) device, at least a first thermal component disposed adjacent to the IC device, and a solder TIM interposed between and thermally coupled with each of the IC device and the first thermal component.

15 Claims, 5 Drawing Sheets

COMPOSITE SOLDER TIM FOR ELECTRONIC PACKAGE

FIELD OF THE INVENTION

The invention relates generally to the field of semiconductor device manufacturing. In particular, the invention relates to composite thermal interface materials for electronic packaging.

BACKGROUND OF THE INVENTION

Modern integrated circuit (IC) devices generate large amounts of thermal energy during operation, which negatively impacts their performance, and if not removed, can cause damage through various mechanisms. The two most common forms of heat related damage include separation of dissimilar materials due disparate rates of thermal expansion, and cracking due to material stress during thermal expansion and contraction. Therefore, a number of cooling devices are implemented to remove thermal energy from integrated circuit devices. Most such devices function at least in part by thermal conduction through physical contact with a portion of an IC device.

Resistance to thermal conduction at an interface between an IC device and a cooling device can undermine the efficiency and effectiveness of the cooling device. Therefore, numerous thermal interface materials (TIMs) have been developed to more efficiently conduct heat from the IC device to the cooling device. For example, indium, which is quite malleable, has a relatively low melting temperature, and conducts thermal energy fairly effectively, has emerged as a useful thermal interface material. The market cost of indium, however, has dramatically increased recently, substantially increasing the cost of IC device packages utilizing an indium TIM. Changing to a different material entails sacrificing some of the benefits provided by indium, or, alternatively, involves more complicated and/or expensive manufacturing process. For example, attempting to implement a TIM which is less malleable or has a substantially higher melting point, presents substantial challenges and a potential obstacle to the current pace of development and implementation of very small but powerful IC device technologies. Applications calling for a very thin TIM in a thin bondline between an IC device and a cooling device particularly benefit from the inherent characteristics of indium.

DETAILED DESCRIPTION OF THE INVENTION

Thixocasting involves cooling a molten mixture while agitating the mixture, typically by stirring or otherwise inducing turbulent flow in the mixture. As the mixture cools, materials in the mixture having a higher melting temperature typically separate out from the mixture and solidify. However, due to the agitation, the solidifying materials are unable to form unified structures, such as dendritic 'trees'. Rather, the material is broken up into relatively small particles as it solidifies, and remains distributed throughout the agitated mixture, in some cases forming a metallic slurry.

A mixture can eventually cool sufficiently for all the constituent materials of the mixture to solidify, forming a solid or semisolid end state with constituent materials suspended as relatively small particles, crystals, grains, or other similar configurations throughout a 'host' material. A host material can be considered that material in a mixture having the lowest melting temperature of the constituents, and therefore remaining in liquid form after the other materials have solidified. Thixocasting is useful for mixing and casting composite materials from constituent materials considered immiscible, as in the case of an indium-aluminum mixture.

According to embodiments described herein, a composite solder material is formed through thixocasting, including an indium 'host' material and aluminum particles dispersed within the indium. The majority of the aluminum particles remain enclosed within the liquid and solid indium during thixocasting, substantially isolated from atmospheric oxygen. Therefore, the aluminum particles remain substantially free from oxidation. A small amount of the aluminum particles will likely form at or be stirred to an outer extent of the indium material. There, they may coming into contact with atmospheric oxygen, and may accumulate a small amount of oxidation. However, it is expected that the overall amount of oxidized aluminum particles in a thixocast mixture will remain extremely low; that is, substantially oxygen free. Further, as discussed below, there are ways to exclude atmospheric oxygen from contact with a mixture during thixocasting.

While particles of aluminum can simply be mixed into molten indium to achieve a similar distribution and displacement of indium as in a thixocast material, preformed particles of aluminum will typically have an amount of oxidation formed at their surfaces, due to exposure to atmospheric oxygen prior to addition to the indium. The oxide material interferes with the thermal conductivity of the aluminum, resulting in a mixture with poorer thermal conductivity properties and performance than a thixocast material having the same amount of indium and aluminum. Additionally, thixocast particles tend to form as spherical or spheroidal particles, further differentiating them from most preformed aluminum particles that may be simply mixed into molten indium. Still further, aluminum particles formed within a thixocast mixture are less likely to include impurities than extrinsically formed aluminum particles, due to the controlled conditions of particle formation in an indium host material during thixocasting.

A composite thixocast material comprising indium and an amount of aluminum will possess a smaller amount of indium than will an identical quantity of pure indium, as the aluminum in the material replaces some quantity of indium. This provides numerous benefits. Aluminum is far less expensive than indium, so a 1:1 mixture of indium and aluminum, for example, substantially reduces the material cost for a given quantity of solder material relative to a pure indium material. At the same time, aluminum has a substantially higher thermal conductivity (235 W/mk) than does indium (86 W/mk), so the thermal conductivity of the material is substantially improved. Therefore, a solder thermal interface material ('STIM', or 'TIM') formed of a thixocast mixture of indium and aluminum has a lower cost and an improved thermal performance relative to TIMs formed of indium alone.

Indium and aluminum are excellently matched for combining in a thixocast mixture, having nearly equivalent coefficients of thermal expansion (CTE) of 27 and 25 ppm/° C. (parts per million/degree centigrade), respectively. Therefore, any thermal strain developed by thermal cycling of a thixocast material of indium and aluminum should be very low, which helps to avoid damage such as delamination or cracking typically seen in combinations of materials with more disparate CTEs. Although aluminum is stiffer than indium, even pure aluminum is fairly soft, flowing at approximately 40 MPa, which is comparable to or lower than the flow stress of many conventional solder materials. However, since the aluminum in a thixocast material with indium is in the form of particles distributed throughout the indium, the indium will preferentially deform under stress rather than the relatively stiffer aluminum. These favorable qualities, in addition to the beneficial cost savings, make a thixocast indium-aluminum material an excellent replacement for pure indium as a TIM material in integrated circuit packages, particularly when used in a thin bond line between a thermal component and an IC chip or another thermal component.

Figure 1:
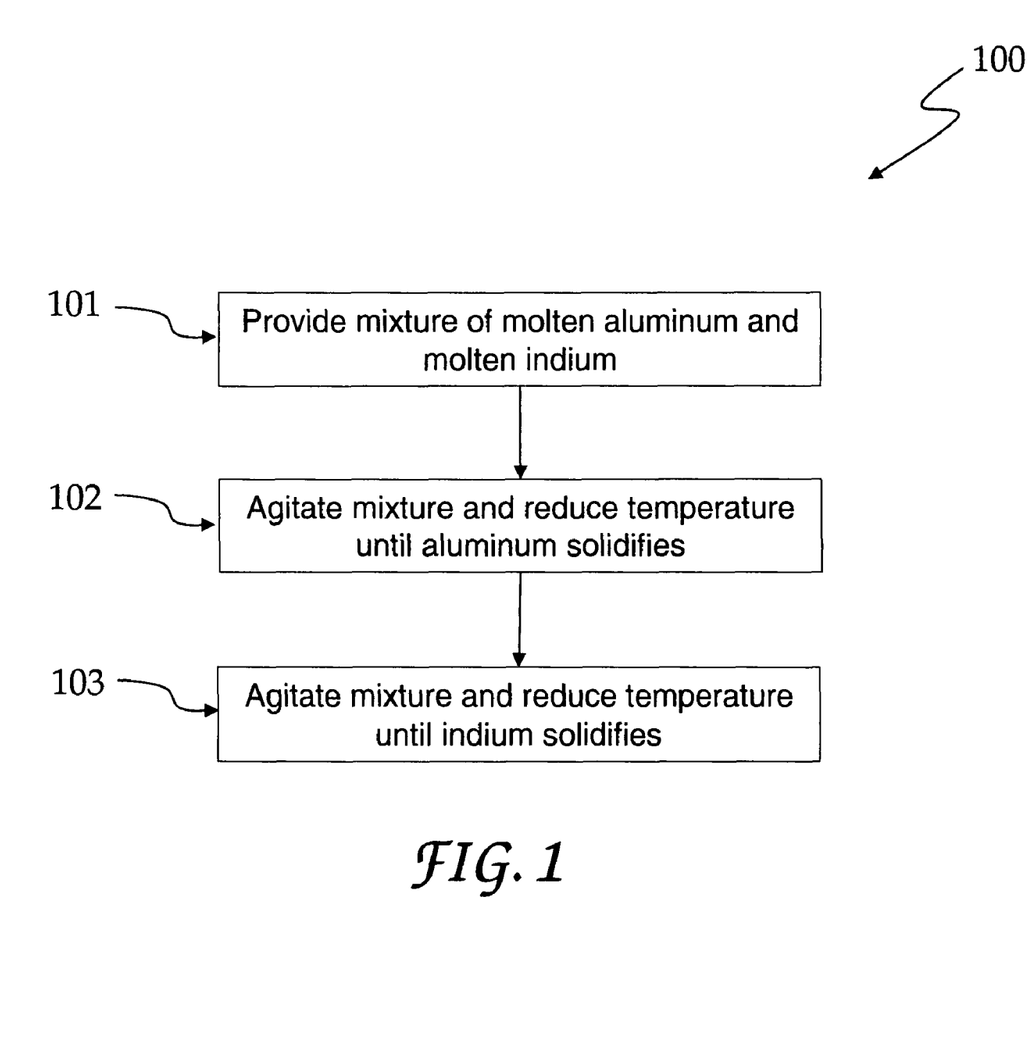
FIG. 1 depicts a block diagram of a method of forming a composite solder thermal interface material (TIM) according to an embodiment of the invention.
Figure 2:
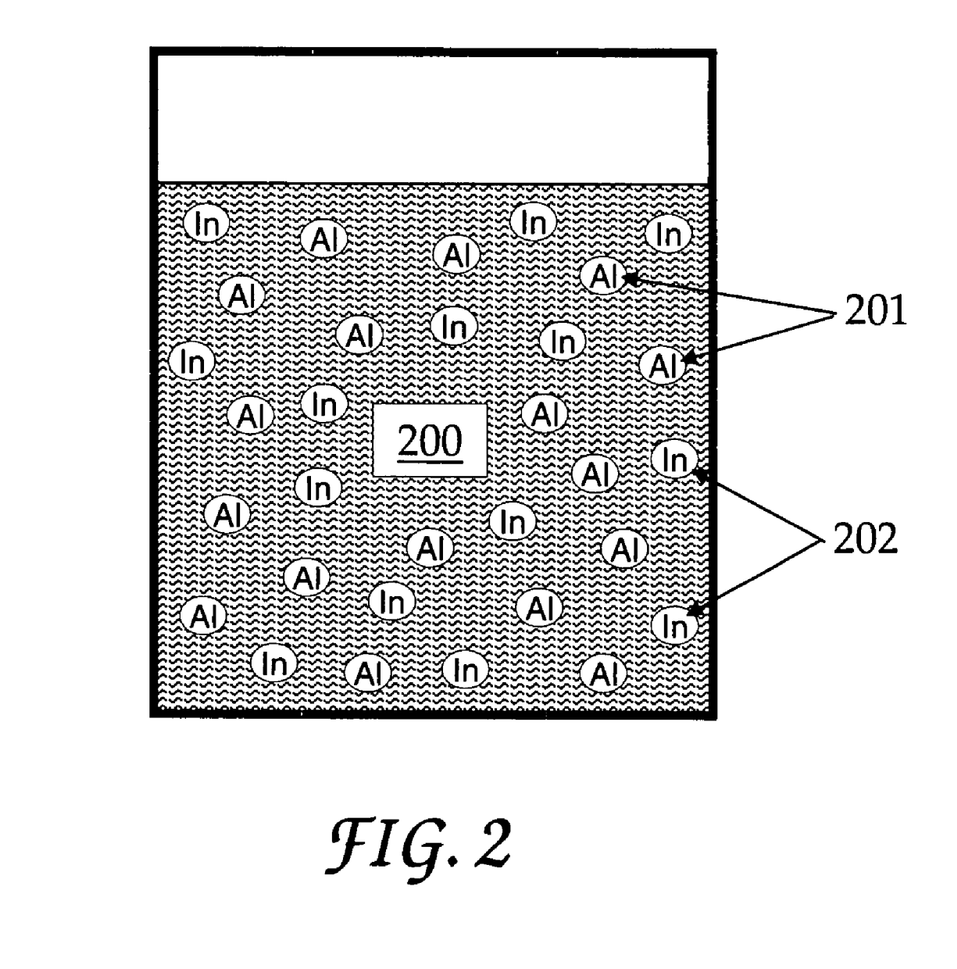
FIG. 2 depicts a cross-sectional diagram of a mixture of molten indium and molten aluminum according to an embodiment of the invention.

Referring to FIG. 1, an embodiment of a method 100 for forming a composite solder material includes, at 101, providing a mixture of molten aluminum and molten indium. A molten mixture 200, depicted in FIG. 2, can be provided in a variety of ways, including by mixing a quantity of molten indium with a quantity of molten aluminum, or by mixing solid indium ingots and solid aluminum ingots and then melting the mixture, or by adding a quantity of a solid constituent (e.g., either indium or aluminum) to a molten quantity of the other constituent, although the embodiments are not so limited. For example, the indium and aluminum could also be provided as a single solidified ingot, which can then be melted. Regardless the specific approach taken, a molten mixture 200 including both aluminum 201 and indium 202 is provided. FIG. 2 is a diagrammatic depiction intended to show that both molten aluminum and indium exist in a molten mixture. It is not intended to depict a specific number of liquid phases, to suggest the presence of other materials in a molten mixture than just aluminum and indium, nor to exclude other materials from such a mixture. A molten mixture may exist as a single liquid phase at a high temperature, as described below, or as, for example two liquid phases as when both the indium and aluminum are molten but the temperature is not yet sufficiently elevated to form a single liquid phase of indium and aluminum. FIG. 2 likewise is not intended to suggest that either the indium or aluminum exists in the mixture in a particular configuration (e.g., spherical particles). Rather, FIG. 2 is presented simplistically to avoid complicating the description.

Melting aluminum and indium as described can be accomplished using a thermally adjustable system, wherein the temperature of a crucible or other reservoir configured to contain a molten material, can be increased and/or decreased with a significant amount of control. For example, ingots of aluminum and indium in a crucible can be heated electrically, by open flame, or some other method, wherein the heat source can be increased or decreased in intensity, either incrementally or continuously. A thermally insulating structure can be used to slow the rise or fall of the temperature of the ingots or of a molten material. For example, an insulating material surrounding at least a portion of a crucible of molten aluminum and indium may be partially or entirely removed, increasing the rate of heating or cooling of the mixture. If rapid heating or cooling is desired, a heat conducting liquid or gas can also be flowed over, around, and/or through the molten mixture (e.g. such as through a tube or plurality of tubes passing through and/or around the mixture) to increase the rate of thermal transfer to or away from the molten mixture to the liquid or gas.

In the case of a gas or gaseous mixture flowed over or around a molten mixture to induce heating or cooling, and in which the gas is not separated from the molten mixture, it is beneficial to exclude oxygen to prevent oxidation of the molten materials. If oxygen is allowed into contact with the molten mixture, particularly during a cooling sequence, oxidation can form and detrimentally affect the thermal properties of the finally formed composition. To avoid this result, nitrogen can be used for cooling the molten mixture and/or for excluding oxygen during cooling. It may however, be beneficial in some situations to exclude nitrogen or minimize the amount of nitrogen used, as nitrogen can react with the indium detrimentally affecting the thermal performance of a composite solder TIM. Alternatively, a continuous flow of a relatively inert gas, for example argon, can be provided at the surface of a molten mixture in a crucible, excluding non-inert gases from the headspace of the crucible and preventing them from reacting with the molten materials during heating or cooling. An apparatus for providing a molten mixture can be configured for limiting the atmospheric gases allowed into contact with the molten mixture. Regardless the exact apparatus or system used for melting the mixture, it will be configured to provide substantial thermal control while melting the mixture, and while subsequently cooling the mixture as described below.

As mentioned, a mixture of 50% indium and 50% aluminum provides substantial benefits. However, according to alternate embodiments, the aluminum composition of a thixocast mixture with indium can vary from as little as approximately 15% aluminum by volume to as much as approximately 80% by volume. For example, a 'lean' mixture of between 15-35% aluminum provides many of the benefits of aluminum, while still greatly preserving the characteristics of indium in a composite TIM. In another example, a compositional range of between 35-65% aluminum balances the benefits of both aluminum and indium approximately equally. Is still another example, a compositions range of between 65-80% aluminum provides a higher level of thermal conductivity for thermally demanding applications, while still benefiting from the malleability of an indium host material. Additionally, small amounts of copper, for example up to approximately 5% by weight, can be used to help strengthen the interfaces within a composite material formed by thixocasting. In a particularly useful aspect, a readily available alloy of approximately 96% aluminum and approximately 4% copper can be used. This alloy has a melting temperature ($T_m$) very similar to that of pure aluminum, and can be provided as an ingot or in another convenient form for melting with indium.

The melting temperatures of indium and aluminum are quite different, with indium melting at approximately 156° C. (centigrade), and aluminum melting at approximately 660° C. Indium and aluminum are considered an 'immiscible' alloy system, as the two metals do not mix well, due in part to their considerable difference in atomic weights, and therefore, their density of one relative to the other. Therefore, even when heated marginally above the melting temperature of aluminum, the molten aluminum and molten indium remain two separate liquid phases in the mixture However, when heated to extremely high temperatures, for example to or above approximately 875° C. at approximately 1 (one) atmosphere, the metals form a perfect mixture at a single liquid phase. When a molten mixture of the two is cooled without controlling the solidification conditions according to thixocasting methods, aluminum tends to separate out to the top of the mixture, while indium tends to separate toward the bottom of the mixture, forming two separate zones; one aluminum rich, and the other indium rich.

Therefore, as seen at 102 of FIG. 1, the mixture is agitated during cooling to break apart dendritic aluminum structures before they can substantially form, and to prevent the aluminum and indium from separating. According to a particularly effective embodiment, the mixture is exposed to a continuously changing magnetic field, which induces 'magnetohydrodynamic' stirring and turbulent flow within the mixture. Turbulent flow of a liquid metal over and around the still forming aluminum dentritic structures, exerts both tensile and shear forces upon the dendrites. When these forces exceed the tensile and/or shear strength of the dendrites, the dendrites will break apart to form aluminum particles. The amount of turbulent flow needed in any particular embodiment depends on the viscosity of the melt, the dimensions of the dendrite, and the processing temperature, among other factors, and therefore should be determined experimentally. Likewise, different compositions of aluminum and indium, as well as different quantities of the molten mixture, may require different magnetic field strengths to maintain sufficient flow throughout the mixture to prevent separation of the aluminum from the indium. However, by simple experimentation, a sufficient field strength can be determined in each instance. A magnetic field can be generated by thixocasting equipment. Such equipment is used to make automobile parts using conventional aluminum structural alloys (e.g., miscible alloy systems).

Alternatively, agitating a mixture during thixocasting involves mechanically stirring the mixture vigorously enough to break the solidifying aluminum into particles, which are then distributed throughout the mixture and prevented from settling out from the mixture. One example of mechanical stirring includes inserting a device into the mixture and moving the device to induce and/or maintain movement within the mixture, although the embodiments are not so limited. Of course, a device inserted into the mixture for stirring would typically have a higher melting temperature than the maximum temperature of the mixture so that the device would not melt.

Figure 3:
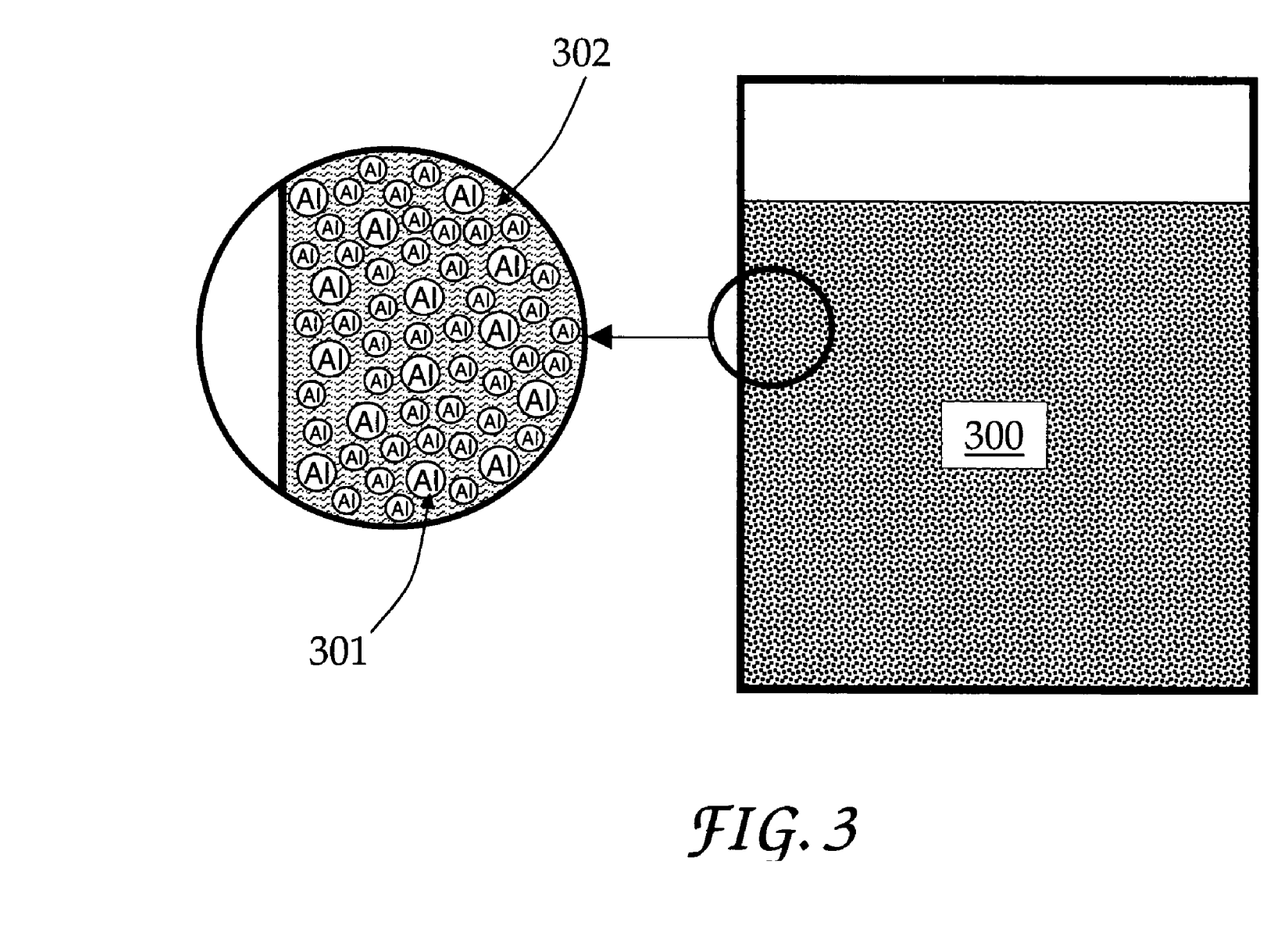
FIG. 3 depicts a cross-sectional diagram of aluminum particles dispersed in molten indium according to an embodiment of the invention.

As the temperature of the mixture is reduced through a thermal zone (range of temperatures) including the melting temperature of the aluminum in the mixture, the aluminum begins to solidify throughout the mixture. Absent agitation, solidifying aluminum will separate from the still molten indium and form dendritic growth throughout the mixture. However, sufficient agitation continuously breaks apart the forming dendrites and distributes the relatively small particles of solidifying aluminum throughout the still molten indium. Further, due to the circulation of the particles throughout the mixture, the particles tend to assume a roughly spherical shape, rather than the tree-like form typical of dendritic growth. As the temperature of the mixture decreases, new particles form and existing particles continue to grow, until the resulting mixture 300, as depicted in FIG. 3, includes molten indium 302 with small, roughly spherical particles of solid aluminum 301 distributed throughout. At some point, when the temperature of the mixture falls below the melting temperature of aluminum, all or substantially all of the aluminum in the mixture will exist as solid particles 301.

At this stage, if agitation ceases, the indium and aluminum will still tend to separate from each other. With reference to FIG. 1 at 103 and FIG. 4, agitation continues as the temperature of the mixture is decreased to at least the temperature at which the indium 402 in the mixture solidifies, keeping the aluminum particles 401 suspended within and distributed throughout the indium 402. Therefore, when the indium 402 in the mixture finally solidifies throughout, the aluminum particles 301 remain distributed, forming a thixocast metal-matrix-composite (MMC) material 400 of aluminum in an indium matrix 402. As a result of the aluminum particles 401 forming within the indium, the particles 401 are substantially free from oxidation. Some particles are likely to be found at the outer edges of the indium matrix 402, and therefore exposed to atmospheric oxygen, so some small amount of oxidation may occur at a portion of the surface of some aluminum particles so situated. However, the vast majority of the particles 401, which form and remain completely surrounded by the indium matrix 402, are free from oxidation, unlike preformed aluminum particles simply placed into molten indium in the manner of convention stir casting. Preformed aluminum particles normally have an outer skin of oxidized aluminum. When used in a traditional stir cast composite material, the oxidation increases the thermal resistance of the material relative to that of a thixocast MMC of aluminum and indium. Therefore, relatively oxidation free aluminum particles provide a composite solder TIM with improved thermal characteristics and performance.

Figure 5:
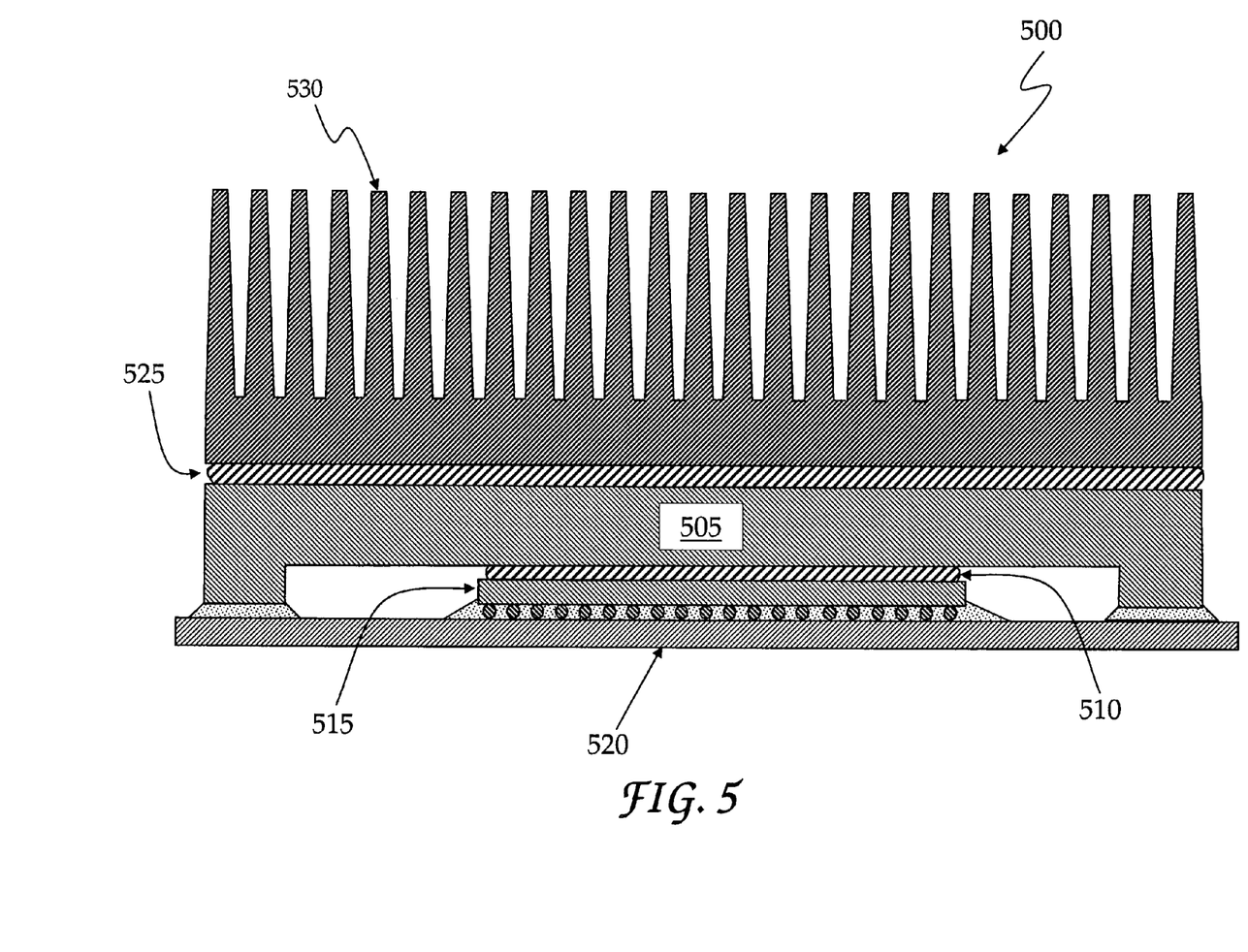
FIG. 5 depicts a cross-sectional view of an assembly including a composite solder TIM disposed between an IC device and a cooling device according to an embodiment of the invention.

Aluminum particles can form in varying sizes. In one example, a relatively thin bondline gap is approximately 200 microns (0.2 millimeters) between an IC device 515 and an IHS 505. In this example, a roughly spherical aluminum particle can likewise be approximately 200 microns in diameter, or could be much smaller. For example, if the aluminum particles are smaller than 50 microns in diameter, more than four particles could align across the width of the bondline gap. In a typical situation, approximately 5-10 particles will be able to align across a bondline gap within a thixocast solder TIM, depending on size variations between the particles. The size of particles within a thixocast composite solder material can be affected by such factors as, for example, the rate of cooling, the rate and method of agitation and the relative amounts of aluminum and indium in a mixture. The equipment, environmental, compositional, and/or processing parameters affecting these and other particle size-determinative factors can be varied through relatively simple experimentation to form particles within a targeted size range according to an intended application.

Figure 4:
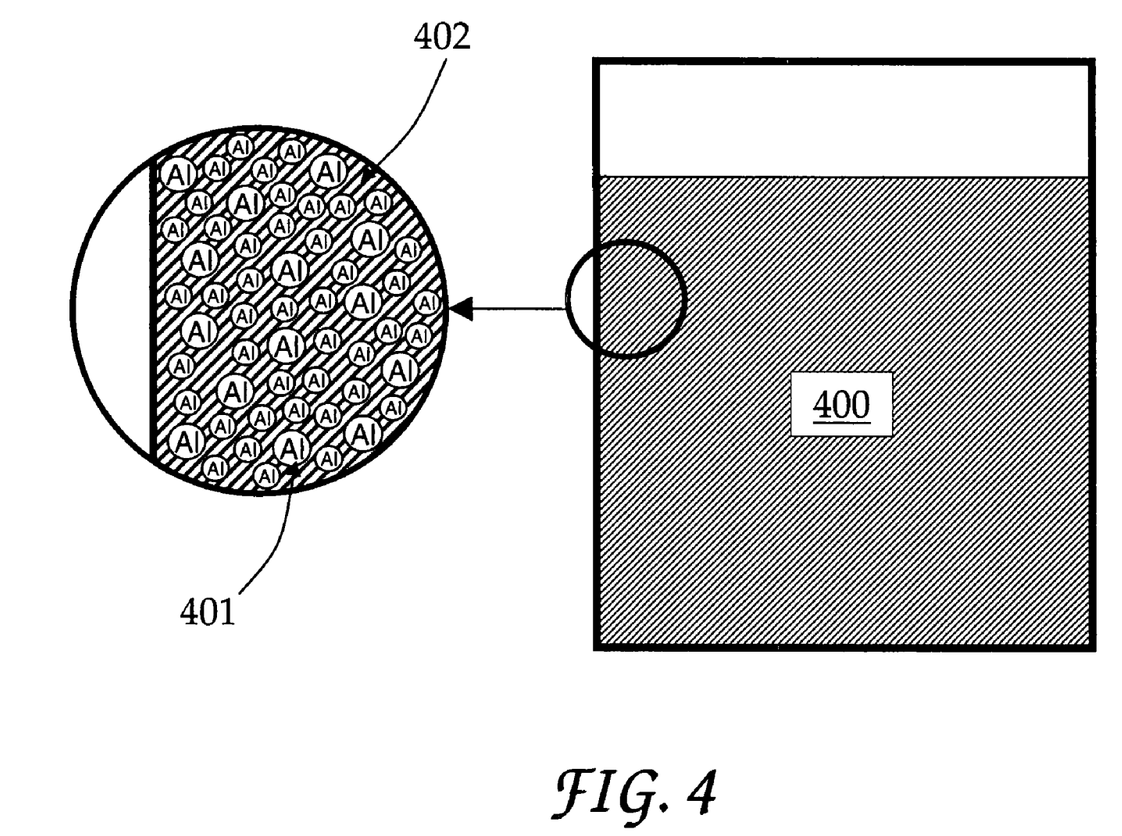
FIG. 4 depicts a cross-sectional diagram of a composite solder material including aluminum particles dispersed in solidified indium according to an embodiment of the invention.

The malleability of the resulting thixocast composite material 400 is comparable to an indium solder material, as it is the indium 402 that tends to deform under stress rather than the aluminum particles 401. Therefore, the thixocast composite material can be relatively easily configured for use as a solder TIM of an integrated circuit package or other similar application calling for a thermal interface material disposed between thermal devices to aid flow of thermal energy between the devices. A thixocast material so configured is considered a 'solder TIM preform', or simply 'preform'.

In an embodiment depicted in FIG. 5, an IC package assembly 500 includes a thixocast solder TIM 510 disposed between an IHS 505 and an IC device 515 to conduct thermal energy from the IC device 515 to the heat spreader 505. At least the IC device 515, and typically also the IHS 505 are further physically coupled with a package substrate 520 or some other substrate. Occasionally, such applications call for a thin bond line gap between the IHS 505 and IC device 515, and the thixocast composite solder material can be rolled or otherwise formed into a thin foil solder TIM preform 510 which will fit into and maintain efficient thermal conduction across a thin bondline gap. Of course, not all solder TIM preforms are configured so thinly, and a composite thixocast material can easily be configured as a relatively thicker solder TIM preform in other applications.

An IC package assembly 500 can then form a portion of a computer system (e.g., personal computer (PC) including a mobile PC or desktop PC, server), an entertainment system (e.g., music player, video player, video game device), a monitoring or measurement system, a vehicular control system (e.g. safety, engine function, navigation, emissions), or other system which utilizes an IC device for signal processing, memory storage, or other such electronic operations. As a portion of one of these systems, the IC device of the package assembly is electrically integrated with the system to receive electrical signals from and/or convey electrical signals with other devices internal and/or external to the system. In the case of a computer system, examples of internal devices may include those provided for system memory devices or media, power regulation devices, or cards provided for purposes such as audio and/or graphics functionality and telephonic or wireless signal connectivity. Examples of external devices may include input devices such as a keyboard or mouse, printers, port expanders, and monitors. These lists, however, are not exclusive, and can include other internal and/or external devices connected to or integrated within computer systems. Further, the IC device can be electrically coupled with the system through a power and/or ground connection. Such signal and/or power/ground connections can be made to the IC device through a printed circuit substrate, such as a package substrate, motherboard, flex substrate, card, or other such printed circuit substrate. Alternatively, a direct signal or power/ground connection can be established between the IC device and another component or device, bypassing a substrate, such as by a wire or other direct connection.

A thixocast composite STIM can also thermally couple a passive cooling device 505 with an active cooling device or with a second passive cooling device 530, providing a thermal interface having low resistance to the flow of thermal energy from one cooling device to the other when interposed between and thermally coupled with them. Examples of passive cooling devices include an IHS and a heat sink, whereas examples of active cooling devices include a thermoelectric cooler (TEC), a multiphase cooler, and a refrigeration device, although the embodiments are not limited to those examples specifically listed here. Passive and active cooling devices, according to the examples provided herein and others reasonably implied and understood from the included descriptions, are considered thermal components with reference to the various embodiments. Therefore, using the example of an assembly described above, an IHS 505 thermally coupled with an IC device 515 by a thixocast composite solder TIM 510 can be further thermally coupled with at least a second cooling device 530, such as a passive or active cooling device. A thixocast composite solder TIM 525 can also provide a thermal interface between the IHS 505 and the second cooling device 530.

To thermally couple a thixocast composite solder TIM with a thermal component, the TIM is disposed adjacent to a bonding surface of a thermal component. The temperature of the TIM is increased to at least the melting temperature of the indium, but not as high as the melting temperature of aluminum. The indium melts and reflows, wetting the bonding surface of the thermal component. The temperature of the mixture is then decreased below the melting temperature of the indium until the indium solidifies. The aluminum particles remain distributed within the indium matrix. As a result, the TIM is not only thermally coupled with the thermal component, but is also physically coupled thereto. In this manner, a thermal component with a thixocast composite solder TIM is provided for later attachment with an IC device or another thermal component. In a like manner, a composite solder TIM can also be provided adjacent to an IC device for later attachment with a thermal component.

A thixocast composite STIM can also be disposed between corresponding bonding surfaces of two or more thermal devices, or an IC device and a thermal device. The STIM is then reflowed to thermally coupled the thermal components (and/or IC device), one to the other(s). When coupling thermal devices according to this approach, the thermal devices can be held at fixed positions relative to each other so that a bondline gap between adjacent and corresponding bonding surfaces is defined and maintained throughout the duration of the STIM reflow process. According to this aspect, the STIM should be in physical contact with each bonding surface prior to reflow to that upon reflowing, the STIM will wet the bonding surface and remain physically coupled with the bonding surface throughout reflow and resolidification.

Alternatively, one thermal component can be placed above (relative to) another with a quantity of STIM disposed between and in physical contact with each of them, and the STIM reflowed without the movement of the upper thermal component being substantially constrained. As the STIM reflows, the fluidity and reduced density of the STIM will allow the upper thermal component to settle downward toward the lower thermal component, reducing a bondline gap width between the adjacent and corresponding bonding surfaces of the thermal components. According to this aspect, a final bondline gap thickness will be defined by such factors as the weight of the upper thermal component, the quantity and degree of lateral spread of the STIM within the bondline gap, the size and quantity of aluminum particles in the STIM, the length of time that the STIM is maintained in a molten state, and other factors.

In another yet similar aspect, a boundary is formed around a bondline gap between two adjacently positioned thermal components. The boundary is configured and positioned relative to the thermal components so as to prevent molten STIM material from escaping from the bondline gap. In this aspect, it is not important whether the thermal components are positioned one atop another, or at some other angle or orientation. During reflow of a STIM disposed in the bondline gap, the thermal components may be held either stationary relative to each other (thus maintaining the width of the bondline gap), or may be moved toward each other (so that the bondline gap width is reduced during reflow). As molten STIM will tend to flow according to the influence of gravity, a boundary formed around the bondline gap contains the flow of molten STIM, keeping it within the bondline gap. A boundary according to such aspects can include a mechanical structure (such as a clamping device), a high temperature gasket, a raised or interlocking feature(s) of one or more of the thermal devices, or other similarly functioning devices.

While numerous embodiments of the invention are described above, the foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

We claim:

1. A method, comprising:
    agitating a mixture of molten indium and molten aluminum comprising between approximately 15% to approximately 80% aluminum by volume while reducing the temperature of the mixture until the aluminum changes from liquid phase to solid phase as particles distributed within the molten indium; and
    agitating the mixture sufficiently to maintain the aluminum distributed throughout the mixture while further reducing the temperature of the mixture until the indium changes from a liquid phase to a solid phase.

2. The method of claim 1, wherein agitating the mixture comprises exposing the mixture to a relatively continuously changing magnetic field.

3. The method of claim 1, wherein agitating the mixture comprises stirring sufficiently vigorously to break the solidifying aluminum into particles and maintain the particles suspended in the molten mixture.

4. The method of claim 1, wherein the mixture comprises between approximately 15% and approximately 80% aluminum by volume.

5. The method of claim 1, wherein providing the mixture comprises combining aluminum and indium in a thermally adjustable system, and elevating the temperature of the combination to at least the melting temperature of aluminum.

6. The method of claim 1, further comprising configuring the solidified indium-aluminum material as a solder thermal interface material (STIM) preform.

7. The method of claim 6, wherein the STIM preform resembles a foil.

8. The method of claim 1, wherein the temperature of the indium-aluminum mixture reaches a minimum of approximately 875 degrees centigrade.

9. The method of claim 1, wherein the aluminum particles in the composite solder material are substantially free from oxidation.

10. A method, comprising:
    agitating a mixture of molten indium and molten aluminum while reducing the temperature of the mixture until the aluminum changes from liquid phase to solid phase as particles distributed within the molten indium; and
    agitating the mixture sufficiently to maintain the aluminum distributed throughout the mixture while further reducing the temperature of the mixture until the indium changes from a liquid phase to a solid phase, wherein the mixture further comprises up to approximately 5% copper by weight.

11. A method of forming an IC package assembly comprising:
    providing an IC device coupled to a package substrate;
    placing a thin foil solder TIM preform between said IC device and a integrated heat spreader, wherein said thin foil solder TIM preform is formed by a method comprising:
        agitating a mixture of molten indium and molten aluminum while reducing the temperature of the mixture until the aluminum changes from liquid phase to solid phase as particles distributed within the molten indium;
        agitating the mixture sufficiently to maintain the aluminum distributed throughout the mixture while further reducing the temperature of the mixture until the indium changes from a liquid phase to a solid phase; and
    reflowing said thin foil solder TIM preform to attach said integrated heat spreader to said microelectronic die;
    placing a second thin foil solder TIM perform formed by said method between said integrated heat spreader and a second cooling device; and
    reflowing said second thin foil solder TIM perform to attach said second cooling device to said integrated heat spreader.

12. The method of claim 11 wherein the mixture comprises between approximately 15% and approximately 80% aluminum by volume.

13. The method of claim 11 wherein the mixture further comprises up to approximately 5% copper by weight.

14. A method of forming an assembly comprising:
    providing an integrated circuit device;
    placing a first thermal component adjacent to said IC device; and
    forming a solder thermal interface material (STIM) between and thermally coupled to said IC device and said first thermal component, said solder thermal interface material (STIM) comprising particles of aluminum suspended in indium wherein said solder thermal interface material comprises between approximately 15% and approximately 80% aluminum by volume.

15. A method of forming an assembly comprising:
    providing an integrated circuit device;
    placing a first thermal component adjacent to said IC device; and
    forming a solder thermal interface material (STIM) between and thermally coupled to said IC device and said first thermal component, said solder thermal interface material (STIM) comprising particles of aluminum suspended in indium, wherein said solid thermal interface material comprises up to approximately 5% copper by weight.

* * * * *